US008236381B2

(12) United States Patent
Okubo

(10) Patent No.: US 8,236,381 B2
(45) Date of Patent: Aug. 7, 2012

(54) METAL PIPERIDINATE AND METAL PYRIDINATE PRECURSORS FOR THIN FILM DEPOSITION

(75) Inventor: Shingo Okubo, Ibaraki (JP)

(73) Assignee: L'Air Liquide Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 436 days.

(21) Appl. No.: 12/538,513

(22) Filed: Aug. 10, 2009

(65) Prior Publication Data

US 2010/0034695 A1 Feb. 11, 2010

Related U.S. Application Data

(60) Provisional application No. 61/087,375, filed on Aug. 8, 2008.

(51) Int. Cl.
C23C 16/00 (2006.01)
(52) U.S. Cl. ........... 427/255.31; 427/255.28; 427/248.1; 427/255.26
(58) Field of Classification Search ............... 427/248.1, 427/255.28, 255.31
See application file for complete search history.

(56) References Cited

U.S. PATENT DOCUMENTS

| | | | |
|---|---|---|---|
| 4,377,613 A | 3/1983 | Gordon | |
| 4,419,386 A | 12/1983 | Gordon | |
| 5,656,338 A | 8/1997 | Gordon | |
| 6,005,127 A * | 12/1999 | Todd et al. ........................ | 556/70 |
| 6,984,591 B1 | 1/2006 | Buchanan et al. | |
| 7,413,776 B2 | 8/2008 | Shenai-Khatkhate et al. | |
| 7,838,329 B2 * | 11/2010 | Hunks et al. .................. | 438/102 |
| 2006/0138393 A1 | 6/2006 | Seo et al. | |
| 2006/0172067 A1 | 8/2006 | Ovshinsky et al. | |
| 2006/0172068 A1 | 8/2006 | Ovshinsky | |
| 2006/0180811 A1 | 8/2006 | Lee et al. | |
| 2006/0292301 A1 | 12/2006 | Herner | |
| 2007/0054475 A1 | 3/2007 | Lee et al. | |
| 2008/0003359 A1 | 1/2008 | Gordon et al. | |
| 2008/0026577 A1 | 1/2008 | Shenai-Khatkhate et al. | |
| 2008/0096386 A1 | 4/2008 | Park et al. | |
| 2008/0279386 A1 | 11/2008 | Kahn | |
| 2009/0112009 A1 * | 4/2009 | Chen et al. ...................... | 556/12 |

FOREIGN PATENT DOCUMENTS

| | | |
|---|---|---|
| EP | 1 180 553 | 2/2002 |
| EP | 1 464 724 | 10/2004 |
| EP | 1 464 725 | 10/2004 |
| EP | 1 806 427 | 7/2007 |
| EP | 1806427 A2 * | 7/2007 |
| EP | 1 995 236 | 11/2008 |
| WO | WO 83 01018 | 3/1983 |
| WO | WO 96 40448 | 12/1996 |
| WO | WO 98 16667 | 4/1998 |
| WO | WO 00 23635 | 4/2000 |
| WO | WO 00 29637 | 5/2000 |
| WO | WO 01 66816 | 9/2001 |
| WO | WO 02 27063 | 4/2002 |
| WO | WO 03 083167 | 10/2003 |
| WO | WO 2007 062096 | 5/2007 |
| WO | WO 2007 067604 | 6/2007 |
| WO | WO 2007 133837 | 11/2007 |
| WO | WO 2008 002546 | 1/2008 |
| WO | WO 2008 008319 | 1/2008 |
| WO | WO 2008 057616 | 5/2008 |
| WO | WO 2008057616 A2 * | 5/2008 |
| WO | WO 2009 039187 | 3/2009 |

OTHER PUBLICATIONS

Bonasia, P.J. et al. "New reagents for the synthesis of compounds containing metal-tellurium bonds: sterically hindered silyltellurolate derivatives and the x-ray crystal structures of [(THF)2LiTeSi(SiMe3)3]2 and [(12-crown-4)2Li][TeSi(SiMe3)3]", J. Am. Chem. Soc., 1992, 114 (13), pp. 5209-5214.
Breunig, H.J. "Thermochromic molecules with bonds of Se or Te and Sb or Bi", Phosphorus and Sulfur, 1988, vol. 38, pp. 97-102.
Choi, et al. "Plasma-enhanced atomic layer deposition of $Ge_2Sb_2Te_5$ films using metal-organic sources for Phase change RAM." ALD 2006 proceedings, p. 62, 2006.
Drake, J.E. et al. "Studies of silyl and germyl group 6 species. 5. Silyl and germyl derivatives of methane- and benzenetellurols," Inorg. Chem. 1980, 19, pp. 1879-1883.
King, R.B. "Secondary and tertiary phosphine adducts of germanium(II) iodide", Inorganic Chemistry, vol. 2, No. 1, Feb. 1963.
Pore, V. et al. "Atomic layer deposition of metal tellurides and selenides using alkylsilyl compounds of tellurium and selenium," J. Am. Chem. Soc., DOI 10.1021/ja08090388.
Razuvaev, G.A. et al. "Organosilicon and organogermanium derivatives with silicon-metal and germanium-metal bonds," http://media.iupac.org/publications/pac/1969/pdf/1903x0353.pdf.
Shcherbinin, V.V. et al. "Methods for preparing germanium dihalides," Russian J. of General Chem., vol. 68, No. 7, 1998, pp. 1013-1016.
International Search Report and Written Opinion for PCT/US2008/076698 / U.S. Appl. No. 12/212,350.
International Search Report and Written Opinion for PCT/IB2008/055499 / U.S. Appl. No. 12/341,685.

(Continued)

Primary Examiner — David Turocy
(74) Attorney, Agent, or Firm — Patricia E. McQueeney

(57) ABSTRACT

Methods and compositions for depositing a film on one or more substrates include providing a reactor and at least one substrate disposed in the reactor. At least one lanthanide precursor is provided in vapor form and a lanthanide metal thin film layer is deposited onto the substrate.

12 Claims, No Drawings

OTHER PUBLICATIONS

Herrmann, W.A. et al. "Stable cyclic germanediyls ("cyclogermylenes"); Synthesis, structure, metal complexes, and thermolyses." Angew. Chem. Int. Ed. Engl., (1992) 31, No. 11, pp. 1485-1488.

Prokop, J. et al. "Selective deposition of amorphous germanium on Si with respect to $SiO_2$ by organometallic CVD." J. NonCryst. Solids, 198-200 (1996) pp. 1026-1028.

Glatz, F. et al. "Thermal CVD of amorphous germanium films from 2,5-bis(tert.-butyl)-2,5-diaza-1-germa-cyclopentane organometallic precursor." Mat. Res. Soc. Symp. Proc., 1994, vol. 336, pp. 541-545.

Lee, J. et al. "GeSbTe deposition for the PRAM application". Appl. Surf. Sci., 253, pp. 3969-3976, 2007.

Lappert, M.F. et al. "Monomeric, coloured germanium(II) and tin(II) di-t-butylamides, and the crystal and molecular structure of $Ge(NCMe_2[CH_2]_3CMe_2)_2$". J. Chemical Soc. Chem. Comm. 1980, pp. 621-622.

Choi B. J. et al. "Cyclic PECVD of $Ge_2Sb_2Te_5$ films using metal-lorganic sources." J. Electrochem. Soc., 154 (4) H318-H324 (2007).

Kim, R.-Y. et al. "Structural properties of $Ge_2Sb_2Te_5$ thin films by metal organic chemical vapor deposition for phase change memory applications". Appl. Phys. Lett., 89, 102107-1-102107-3, 2006.

Kim et al. "Phase separation of a $Ge_2Sb_2Te_5$ alloy in the transition from an amorphous structure to crystalline structures". J. Vac. Sci. Technol. 929, 24(4), 2006.

Wang et al. "Influence of Sn doping upon the phase change characteristics of $Ge_2Sb_2Te_5$". Phys. Stat. Sol. (A) 3087-3095, 201(14), 2004.

Gonzalez-Hernandez et al. "Structure of oxygen-doped Ge:Sb:Te films". Thin Solid Films (2006), 503(1-2), 13-17.

Gu et al. "Optical and structural properties of oxygen-doped and annealed Ge-Sb-Te- thin films". Chinese Journal of Lasers (2003), 30(12), 1110-1115 (Japanese text, English abstract).

* cited by examiner

METAL PIPERIDINATE AND METAL PYRIDINATE PRECURSORS FOR THIN FILM DEPOSITION

CROSS-REFERENCE TO RELATED APPLICATIONS

The present application claims the benefit of U.S. Provisional Application Ser. No. 61/087,375, filed Aug. 8, 2008, herein incorporated by reference in its entirety for all purposes.

BACKGROUND

1. Field of the Invention

This invention relates generally to compositions, methods and apparatus for use in the manufacture of semiconductor, photovoltaic, LCD-TFT, or flat panel type devices. More specifically, the invention relates to methods of forming a thin film on a substrate.

2. Background of the Invention

One reason the requirements for suitable metallorganic precursors, used in chemical vapor depositions (CVD) and/or atomic layer depositions (ALD) for semiconductor manufacturing processes, are increasing is due to the high surface coverage required by the deposited films, as compared to that found through physical vapor deposition methods (e.g. PVD, sputtering method).

For example, preferred production methods for GeSbTe alloy thin films, which are used in phase change memory devices, are changing from PVD methods to CVD/ALD methods with the increasing the capacity of memory cell. The demonstration sample of 512 Mega-bit PRAM was made by PVD method under 90 nm technology node processes in 2007, however in the future CVD/ALD methods will likely be necessary for the production of giga-bit scale (and greater) PRAM devices. A main issue for these future production methods is identifying suitable precursors which will allow for a low temperature, low impurity CVD/ALD film deposition. Similar situations are seen in many stages of semiconductor device manufacture. For instance, precursors for deposition of metallic titanium films are needed, due to the high level of impurities observed in the current processes.

Consequently, there exists a need for a need for materials and methods to deposit precursors to form thin films in semiconductor manufacturing processes.

BRIEF SUMMARY

The invention provides novel methods and compositions for the deposition of a metal containing layer on a substrate. In an embodiment, a method for depositing a metal containing layer on a substrate comprises providing a reactor, and at least one substrate disposed in the reactor. A precursor-containing vapor is introduced into the reactor. The vapor contains at least one precursor of the general formula (I) or (II):

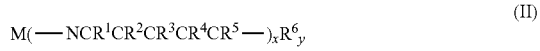

wherein M is a metal from the periodic table of elements and each R is independently selected from among: H; C1-C6 alkyls; C1-C6 alkoxys; C1-C6 alkylsilyls; C1-C6 perfluorocarbons; C1-C6 alkylsiloxys; C1-C6 alkylaminos; alkylsilylaminos; and aminoamido groups. The sum of x and y, which are both integers inclusively ranging between 0 and 6, is equal to the oxidation number of the metal M. The reactor is maintained at a temperature of at least about 100° C., and the precursor-containing vapor is contacted with at least part of the substrate to form a lanthanide containing layer on the substrate through a vapor deposition process.

Other embodiments of the current invention may include, without limitation, one or more of the following features:
  M is one of germanium, tellurium, and antimony;
  the precursor is one of: tetrapiperidinogermanium; di(piperidinato)diethylgermanium; tetrakispyridinatogermanium; bis(2,6-dimethylpyridinato)diethylgermanium; dipiperidinotellurium; and tripiperidinoantimony;
  maintaining the reactor at a temperature between about 100° C. and about 500° C., and preferably between about 200° C. and about 350° C.;
  maintaining the reactor at a pressure between about 1 Pa and about $10^5$ Pa, and preferably between about 25 Pa and about $10^3$ Pa;
  introducing at least one reducing gas into the reactor, wherein the reducing gas is at least one of: hydrogen; ammonia; silane; disilane; trisilane; hydrogen radicals; and mixtures thereof;
  introducing at least one oxidizing gas into the reactor, wherein the oxidizing gas is at least one of: oxygen; ozone; water; hydrogen peroxide; nitric oxide; nitrous oxide; oxygen radicals; and mixtures thereof;
  the metal precursor and the reducing gas and/or the oxidizing gas are introduced into the chamber either substantially simultaneously or sequentially;
  the metal precursor and the reducing gas and/or the oxidizing gas are introduced into the chamber substantially simultaneously and the chamber is configured for chemical vapor deposition;
  the metal precursor and the reducing gas and/or oxidizing gas are introduced into the chamber sequentially and the chamber is configured for atomic layer deposition;
  the deposition process is a plasma enhanced deposition process (ALD or CVD);
  the metal containing layer on the substrate is a pure metal film or a metallic compound film; and
  a metal containing thin film coated substrate.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

NOTATION AND NOMENCLATURE

Certain terms are used throughout the following description and claims to refer to various components and constituents. This document does not intend to distinguish between components that differ in name but not function. Generally as used herein, elements from the periodic table of elements may be abbreviated with their standard abbreviations (e.g. Ge=germanium; Te=tellurium; Sb=antimony; etc).

As used herein, the abbreviations: Be, B, Mg, Al, Si, P, S, Ca, Sc, Ti, V, Cr, Mn, Fe, Co, Ni, Cu, Zn, Ga, Ge, As, Se, Sr, Y, Zr, Nb, Mo, Ru, Rh, Pd, Ag, Cd, In, Sn, Sb, Te, Ba, La, Ce, Pr, Nd, Sm, Eu, Gd, Tb, Dy, Ho, Er, Tm, Yb, Lu, Hf, Ta, W, Re, Os, Ir, Pt, Au, Hg, Tl, Pb, Bi, N, C, H and O generally refer to the corresponding elements from the periodic table of elements.

As used herein, the term ""alkyls" or alkyl group" refers to saturated functional groups containing exclusively carbon and hydrogen atoms. Further, the term "alkyls" or "alkyl group" may refer to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation, "Me," refers to a methyl group; the abbreviation, "Et," refers to an ethyl group; the abbreviation, "t-Bu," refers to a tertiary butyl group; the abbreviation "iPr", refers to an isopropyl group; the abbreviation "acac", refers to acetylacetonato; and the abbreviation "Cp" refers to a cyclopentadienyl group.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

DESCRIPTION OF PREFERRED EMBODIMENTS

The invention provides novel methods and compositions for the deposition of a metal containing layer on a substrate. In an embodiment, a method for depositing a metal containing layer on a substrate comprises providing a reactor, and at least one substrate disposed in the reactor. A precursor-containing vapor is introduced into the reactor. The vapor contains at least one precursor of the general formula (I) or (II):

$$M(-NCR^1R^2CR^3R^4CR^5R^6CR^7R^8CR^9R^{10}-)_xR^{11}_y \quad (I)$$

$$M(-NCR^1CR^2CR^3CR^4CR^5-)_xR^6_y \quad (II)$$

wherein M is a metal from the periodic table of elements (e.g. Be, B, Mg, Al, Si, P, S, Ca, Sc, Ti, V, Cr, Mn, Fe, Co, Ni, Cu, Zn, Ga, Ge, As, Se, Sr, Y, Zr, Nb, Mo, Ru, Rh, Pd, Ag, Cd, In, Sn, Sb, Te, Ba, La, Ce, Pr, Nd, Sm, Eu, Gd, Tb, Dy, Ho, Er, Tm, Yb, Lu, Hf, Ta, W, Re, Os, Ir, Pt, Au, Hg, Tl, Pb, or Bi), and each R is independently selected from among: H; C1-C6 alkyls; C1-C6 alkoxys; C1-C6 alkylsilyls; C1-C6 perfluorocarbons; C1-C6 alkylsiloxys; C1-C6 alkylaminos; alkylsilylaminos; and aminoamido groups. The sum of x and y, which are both integers inclusively ranging between 0 and 6, is equal to the oxidation number of the metal M. The reactor is maintained at a temperature of at least about 100° C., and the precursor-containing vapor is contacted with at least part of the substrate to form a lanthanide containing layer on the substrate through a vapor deposition process.

In some embodiments, the precursors of general formula (I) and (II) may be shown schematically as:

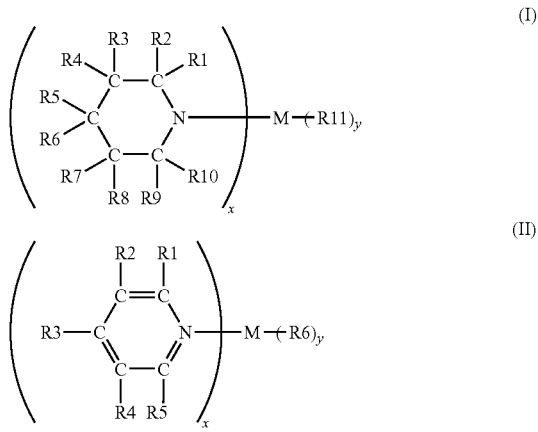

where general formula (I) correspond to a metal-piperidinate precursor and general formula corresponds to a metal-pyridinate precursor.

Embodiments of the metal precursor, as according to the instant invention, may be synthesized in various ways. Examples of synthesis of the metal precursor include, but are not limited to synthesis schemes 1 and 2 shown below (where scheme 1 shows a metal-piperindinate precursor synthesis and scheme 2 shows a metal-pyridinate precursor synthesis):

Scheme 1

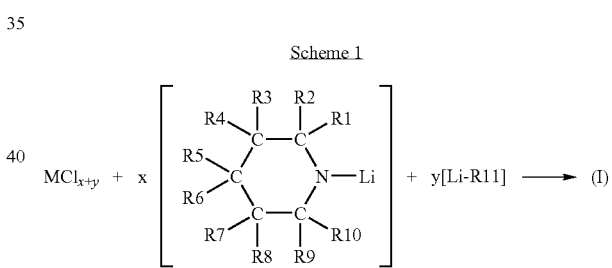

Scheme 2

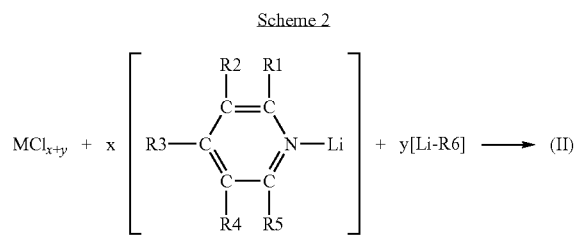

The disclosed precursors may be deposited to form a thin film using any deposition methods known to those of skill in the art. Examples of suitable deposition methods include without limitation, conventional CVD, low pressure chemical vapor deposition (LPCVD), plasma enhanced chemical vapor depositions (PECVD), atomic layer deposition (ALD), pulsed chemical vapor deposition (P-CVD), plasma enhanced atomic layer deposition (PE-ALD), or combinations thereof.

In an embodiment, the precursor is introduced into a reactor in vapor form. The precursor in vapor form may be produced by vaporizing a liquid precursor solution, through a conventional vaporization step such as direct vaporization, distillation, or by bubbling an inert gas (e.g. $N_2$, He, Ar, etc.) into the precursor solution and providing the inert gas plus precursor mixture as a precursor vapor solution to the reactor. Bubbling with an inert gas may also remove any dissolved oxygen present in the precursor solution.

The reactor may be any enclosure or chamber within a device in which deposition methods take place such as without limitation, a cold-wall type reactor, a hot-wall type reactor, a single-wafer reactor, a multi-wafer reactor, or other types of deposition systems under conditions suitable to cause the precursors to react and form the layers.

Generally, the reactor contains one or more substrates on to which the thin films will be deposited. The one or more substrates may be any suitable substrate used in semiconductor, photovoltaic, flat panel or LCD-TFT device manufacturing. Examples of suitable substrates include without limitation, silicon substrates, silica substrates, silicon nitride substrates, silicon oxy nitride substrates, tungsten substrates, or combinations thereof. Additionally, substrates comprising tungsten or noble metals (e.g. platinum, palladium, rhodium or gold) may be used. The substrate may also have one or more layers of differing materials already deposited upon it from a previous manufacturing step.

In some embodiments, in addition to the precursor, a reactant gas may also be introduced into the reactor. In some of these embodiments, the reactant gas may be an oxidizing gas such as one of oxygen, ozone, water, hydrogen peroxide, nitric oxide, nitrogen dioxide, radical species of these, as well as mixtures of any two or more of these. In some other of these embodiments, the reactant gas may be a reducing gas such as one of hydrogen, ammonia, a silane (e.g. $SiH_4$; $Si_2H_6$; $Si_3H_8$), $SiH_2Me_2$; $SiH_2Et_2$; $N(SiH_3)_3$; radical species of these, as well as mixtures of any two or more of these.

In some embodiments, and depending on what type of film is desired to be deposited, a second precursor may be introduced into the reactor. The second precursor comprises another metal source, such as germanium, tellurium, antimony, copper, praseodymium, manganese, ruthenium, titanium, tantalum, bismuth, zirconium, hafnium, lead, niobium, magnesium, aluminum, lanthanum, or mixtures of these. In embodiments where a second metal containing precursor is utilized, the resultant film deposited on the substrate may contain at least two different metal types.

The precursor and any optional reactants or precursors may be introduced sequentially (as in ALD) or simultaneously (as in CVD) into the reaction chamber. In some embodiments, the reaction chamber is purged with an inert gas between the introduction of the precursor and the introduction of the reactant. In one embodiment, the reactant and the precursor may be mixed together to form a reactant/precursor mixture, and then introduced to the reactor in mixture form. In some embodiments, the reactant may be treated by a plasma, in order to decompose the reactant into its radical form. In some of these embodiments, the plasma may generally be at a location removed from the reaction chamber, for instance, in a remotely located plasma system. In other embodiments, the plasma may be generated or present within the reactor itself. One of skill in the art would generally recognize methods and apparatus suitable for such plasma treatment.

Depending on the particular process parameters, deposition may take place for a varying length of time. Generally, deposition may be allowed to continue as long as desired or necessary to produce a film with the necessary properties. Typical film thicknesses may vary from several hundred angstroms to several hundreds of microns, depending on the specific deposition process. The deposition process may also be performed as many times as necessary to obtain the desired film.

In some embodiments, the temperature and the pressure within the reactor are held at conditions suitable for ALD or CVD depositions. For instance, the pressure in the reactor may be held between about 1 Pa and about $10^5$ Pa, or preferably between about 25 Pa and $10^3$ Pa, as required per the deposition parameters. Likewise, the temperature in the reactor may be held between about 100° C. and about 500° C., preferably between about 150° C. and about 350° C.

In some embodiments, the precursor vapor solution and the reaction gas, may be pulsed sequentially or simultaneously (e.g. pulsed CVD) into the reactor. Each pulse of precursor may last for a time period ranging from about 0.01 seconds to about 10 seconds, alternatively from about 0.3 seconds to about 3 seconds, alternatively from about 0.5 seconds to about 2 seconds. In another embodiment, the reaction gas, may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds.

EXAMPLES

The following non-limiting examples are provided to further illustrate embodiments of the invention. However, the examples are not intended to be all inclusive and are not intended to limit the scope of the inventions described herein.

Prophetic Example 1

Metal-containing films may be deposited using precursor of general formula (I), for example, Ge(—NC(CH3)$_2$CH$_2$CH$_2$CH$_2$C(CH3)$_2$—)$_2$. The precursor may be stored in a stainless steel bubbler canister and delivered to the hot-wall reactor by a bubbling method. An inert gas, $N_2$ for instance, may be used as a carrier gas, as well as for dilution purpose. Tests may be done with and without ammonia as a co-reactant.

Under these set-up conditions, it is expected that films may be deposited from about 250° C., and that the deposition rate will reach a plateau at about 350° C.

The concentration of various elements into the deposited films may be analyzed by an Auger spectrometry. It is thought that the concentration of germanium in the films will depend on the deposition parameters. The concentration of oxygen and carbon in the deposited film should be below the detection limit of the apparatus.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method of forming a metal containing layer on a substrate, comprising:

a) providing a reactor and at least one substrate disposed therein;

b) introducing a precursor-containing vapor into the reactor, wherein the precursor-containing vapor comprises a precursor selected from the group consisting of: tetrapiperidinogermanium; di(piperidinato)diethylgermanium; tetrakispyridinatogermanium; bis(2,6-dimethylpyridinato)diethylgermanium; dipiperidinotellurium; and tripiperidinoantimony;

c) maintaining the reactor at a temperature of at least about 100° C.; and d) contacting the precursor-containing vapor with at least part of the substrate, and forming a metal containing layer on the substrate through a vapor deposition process.

2. The method of claim 1, further comprising maintaining the reactor at a temperature between about 100° C. to about 500° C.

3. The method of claim 2, further comprising maintaining the reactor at a temperature between about 200° C. and about 350° C.

4. The method of claim 1, further comprising maintaining the reactor at a pressure between about 1 Pa and about $10^5$ Pa.

5. The method of claim 4, further comprising maintaining the reactor at a pressure between about 25 Pa and about $10^3$ Pa.

6. The method of claim 1, further comprising introducing at least one reducing gas into the reactor, wherein the reducing gas comprises at least one member selected from the group consisting of: $H_2$, $NH_3$; $SiH_4$; $Si_2H_6$; $Si_3H_8$; hydrogen radicals; and mixtures thereof.

7. The method of claim 6, wherein the reducing gas and the precursor are introduced into the chamber substantially simultaneously, and the chamber is configured for chemical vapor deposition.

8. The method of claim 6, the reducing gas, and the precursor are introduced into the chamber sequentially, and the chamber is configured for atomic layer deposition.

9. The method of claim 1, further comprising introducing at least one oxidizing gas into the reactor, wherein the oxidizing gas comprises at least one member selected from the group consisting of: $O_2$; $O_3$; $H_2O$; $H_2O_2$; NO; $N_2O$, oxygen radicals; and mixtures thereof.

10. The method of claim 9, wherein the precursor and the oxidizing gas are introduced into the chamber substantially simultaneously, and the chamber is configured for chemical vapor deposition.

11. The method of claim 9, wherein the precursor and the oxidizing gas are introduced into the chamber sequentially, and the chamber is configured for atomic layer deposition.

12. The method of claim 1, wherein the metal containing layer on the substrate is a pure metal film, or metallic compound film.

* * * * *